United States Patent
Okuno

(10) Patent No.: US 9,755,107 B2
(45) Date of Patent: Sep. 5, 2017

(54) GROUP III NITRIDE SEMICONDUCTOR LIGHT-EMITTING DEVICE

(71) Applicant: TOYODA GOSEI CO., LTD., Kiyosu-shi (JP)

(72) Inventor: Koji Okuno, Kiyosu (JP)

(73) Assignee: TOYODA GOSEI CO., LTD., Kiyosu-Shi, Aichi-Ken (JP)

(*) Notice: Subject to any disclaimer, the term of this patent is extended or adjusted under 35 U.S.C. 154(b) by 0 days.

(21) Appl. No.: 15/255,202

(22) Filed: Sep. 2, 2016

(65) Prior Publication Data

US 2017/0092807 A1   Mar. 30, 2017

(30) Foreign Application Priority Data

Sep. 29, 2015 (JP) ................................. 2015-190740

(51) Int. Cl.

| | |
|---|---|
| H01L 33/14 | (2010.01) |
| H01L 33/00 | (2010.01) |
| H01L 33/44 | (2010.01) |
| H01L 33/04 | (2010.01) |
| H01L 33/32 | (2010.01) |

(52) U.S. Cl.
CPC .......... *H01L 33/14* (2013.01); *H01L 33/0025* (2013.01); *H01L 33/0075* (2013.01); *H01L 33/04* (2013.01); *H01L 33/32* (2013.01); *H01L 33/44* (2013.01)

(58) Field of Classification Search
CPC .......... H01L 33/04; H01L 33/14; H01L 33/32
See application file for complete search history.

(56) References Cited

U.S. PATENT DOCUMENTS

| | | | | |
|---|---|---|---|---|
| 2011/0240957 A1* | 10/2011 | Okuno | .................... | H01L 33/04 257/13 |
| 2012/0037881 A1* | 2/2012 | Kim | ....................... | H01L 33/007 257/13 |

FOREIGN PATENT DOCUMENTS

| | | |
|---|---|---|
| JP | 2002-314205 A | 10/2002 |
| JP | 2003-086903 A | 3/2003 |
| JP | 3909605 B2 | 4/2007 |
| JP | 4153966 B2 | 9/2008 |
| JP | 4685845 B2 | 5/2011 |
| JP | 2011-151074 A | 8/2011 |
| JP | 4879563 B2 | 2/2012 |
| JP | 2012-074705 A | 4/2012 |

(Continued)

*Primary Examiner* — Ermias Woldegeorgis
(74) *Attorney, Agent, or Firm* — McGinn IP Law Group, PLLC

(57) ABSTRACT

The present invention provides a Group III nitride semiconductor light-emitting device exhibiting improved emission efficiency. The Group III nitride semiconductor light-emitting device includes a base layer, an n-type superlattice layer, a light-emitting layer, and a p-type cladding layer, each of the layers being made of Group III nitride semiconductor. An electron injection adjusting layer comprising a single $Al_xGa_{1-x}N$ ($0<x<1$) layer and having a thickness of 5 Å to 30 Å is formed in the base layer. The n-type superlattice layer is a superlattice layer having a periodic structure of an $In_yGa_{1-y}N$ ($0<y<1$) layer, an i-GaN layer, and an n-GaN layer. The electron injection adjusting layer has a thickness of 5 Å to 30 Å and an Al composition ratio of 0.15 to 0.5.

7 Claims, 3 Drawing Sheets

(56) References Cited

FOREIGN PATENT DOCUMENTS

| JP | 2012-222362 A | 11/2012 |
|----|---------------|---------|
| JP | 2013-149938 A | 8/2013 |
| WO | WO 2005/034301 A1 | 4/2005 |

* cited by examiner

GROUP III NITRIDE SEMICONDUCTOR LIGHT-EMITTING DEVICE

BACKGROUND OF THE INVENTION

Field of the Invention

The present invention relates to a Group III nitride semiconductor light-emitting device exhibiting improved emission efficiency.

Background Art

A Group III nitride semiconductor light-emitting device such as high brightness blue LED has been put into practical use. The light-emitting device has a double hetero structure in which a light-emitting layer having a MQW structure is sandwiched between an n-type cladding layer and a p-type cladding layer. Holes injected from the p-type cladding layer to the light-emitting layer hardly overflow from the n-type cladding layer because the holes are effectively confined in the light-emitting layer having a MQW structure due to a short diffusion length. Therefore, there is no need to form a potential barrier layer for the holes in the valence band as the function of the n-type cladding layer.

The inventors of the present invention came up with an idea that a strain relaxing layer having a multiplex period structure made of InGaN/GaN is formed just below the light-emitting layer, instead of the conventional n-type cladding layer for mainly confining holes therein, to improve the crystallinity of the light-emitting layer as shown in Patent Document 1.

Patent Documents 2 and 3 disclose that a light-emitting device having a layered structure of an AlGaN cladding layer, a GaN guide layer, a light-emitting layer (active layer) as an n-type layer side layer structure is known as a general structure.

In Patent Document 4, the electron injection efficiency to the active layer is improved by arranging a periodic structure of AlGaN/GaN/InGaN just below the active layer. Patent Document 4 discloses that two dimensional electron gases is accumulated at a hetero interface between the AlGaN layer and the GaN layer, and the electrons of high mobility are uniformly distributed in a plane surface, thereby improving the electron injection efficiency to the active layer. The strain is relaxed by decreasing the Al composition ratio as approaching the active layer.

Patent Document 1: Japanese Patent Application Laid-Open (kokai) No. 2013-149938
Patent Document 2: Japanese Patent Application Laid-Open (kokai) No. 2011-151074
Patent Document 3: PCT International Application Publication No. WO2005/034301
Patent Document 4: Japanese Patent Application Laid-Open (kokai) No. 2012-222362

As described in Patent Document 1, when the strain relaxing layer made of InGaN/GaN is formed just below the light-emitting layer, the crystallinity of the light-emitting layer is improved, and the electron injection efficiency is increased because of low barrier for electrons. However, the electron density is highest at an interface between the light-emitting layer and the p-type cladding layer due to long diffusion length of the electrons, and a region having a high electron density is formed near the interface so that the electrons are not uniformly distributed in a thickness direction of the light-emitting layer. On the other hand, due to short diffusion length of the holes injected from the p-type cladding layer to the light-emitting layer, the hole density is highest near the interface between the light-emitting layer and the p-type cladding layer and is lowered toward the n-type cladding layer. Thus, the density of electron-hole pairs contributing to light emission is localized near the interface between the light-emitting layer and the p-type cladding layer. As a result, there are a lot of electrons not contributing to light emission, and the emission efficiency is conversely reduced.

In Patent Documents 2 and 3, an AlGaN cladding layer is formed on the n-type layer side, which serves as a barrier layer to block holes diffused in the light-emitting layer. However, the density of electrons injected into the light-emitting layer is not considered.

In Patent Document 4, an n-type cladding layer having a superlattice structure of AlGaN/GaN/InGaN is used to improve the electron injection efficiency by injecting two dimensional electron gas accumulated on the hetero interface into the active layer. However, as a result of improving the electron injection efficiency, unevenness occurred in a thickness direction of electron distribution in the light-emitting layer. A reduction in the emission efficiency due to the unevenness is not considered at all.

Therefore, an object of the present invention is to suppress the increase of drive voltage and improve the emission output and emission efficiency of a Group III nitride semiconductor light-emitting device.

SUMMARY OF THE INVENTION

The invention for solving the aforementioned problems is a Group III nitride semiconductor light-emitting device comprising a substrate, an n-electrode, a layered structure including a single crystal base layer formed on the substrate, an n-type layer side superlattice layer in contact with the base layer, a light-emitting layer in contact with the n-type layer side superlattice layer, a p-type layer side cladding layer, and a p-type layer side contact layer deposited in this order, each of the layers being formed of a Group III nitride semiconductor, and a p-electrode, wherein the n-type layer side superlattice layer has a layered structure of an $In_zGa_{1-z}N$ (0<z<1) layer having a constant composition ratio over the entire cycles and a GaN layer repeatedly deposited, the base layer includes an electron injection adjusting layer which is formed in a path in which the electrons injected from the n-electrode flow to the p-electrode, as a layer disposed in the base layer or a layer in contact with the n-type superlattice layer, and which comprises a single $Al_xGa_yIn_{1-x-y}N$ (0<x<1, 0<y<1, 0<x+y≤1) layer having an electron level of the bottom of conduction band higher than that of any other layers constituting the base layer and having a thickness of 5 Å to 30 Å.

In the present invention, the substrate may be formed of a material different from Group III nitride semiconductor, for example, sapphire, spinel, silicon, silicon carbide, 6H-Sic, zinc oxide, gallium phosphide, gallium arsenide, magnesium oxide, manganese oxide, gallium lithium oxide ($LiGaO_2$), and molybdenum disulfide (MoS).

The electron injection adjusting layer is generally made of $Al_xGa_yIn_{1-x-y}N$ (0<x<1, 0<y<1, 0<x+y≤1), and particularly preferably made of $Al_xGa_{1-x}N$ (0<x<1).

Of the base layer, a region where the electron injection adjusting layer is formed is preferably made of GaN. The entire base layer may be made of GaN. All the single crystal layers existing between the substrate and the n-type layer side superlattice layer constitute the base layer. The base layer refers to a single crystal semiconductor layer epitaxially grown on the buffer layer except for the buffer layer (including the recrystallized buffer layer) when the buffer layer is required for crystal growth on the substrate of a different material. The base layer may be, for example, an n-GaN contact layer, a Si-doped GaN layer, an undoped GaN layer, and a plurality of GaN layers having different Si concentration. In the invention of the present application, the electron injection adjusting layer comprising a single layer made of $Al_xGa_yIn_{1-x-y}N$ ($0<x<1$, $0<y<1$, $0<x+y\leq1$) having a thickness of 5 Å to 30 Å is formed as a layer disposed in the base layer or the top surface layer of the base layer, The n-type layer side superlattice layer has a layered structure of an $In_zGa_{1-z}N$ ($0<z<1$) layer having a constant composition ratio over the entire cycle and a GaN layer repeatedly deposited. The n-type layer side superlattice layer is a layer for suppressing strain from being applied to the light-emitting layer. When a substrate made of a material different from Group III nitride semiconductor is employed, large strain is applied to the light-emitting layer. Therefore, an InGaN/GaN superlattice layer is preferably formed.

The electron injection adjusting layer preferably has an Al composition ratio x of 0.15 to 0.5, and a Ga composition ratio y of 0.5 to 0.85.

An $In_zGa_{1-z}N$ ($0<z<1$) layer or an n-type GaN layer is preferably in contact with the surface at the light-emitting layer side of the electron injection adjusting layer. When the $In_zGa_{1-z}N$ ($0<z<1$) layer is employed, tensile strain is applied in a thickness direction of the $In_zGa_{1-z}N$ ($0<z<1$) layer having a lattice constant larger than that of the electron injection adjusting layer, and compression strain is applied in a thickness direction of the electron injection adjusting layer having a small lattice constant. As a result, a large piezoelectric polarization occurs in a +c axis direction of the $In_zGa_{1-z}N$ ($0<z<1$) layer, and a small polarization (spontaneous polarization and piezoelectric polarization) occurs in a −c axis direction of the electron injection adjusting layer. Since the Group III nitride semiconductor is epitaxially grown in the +c axis direction, negative charges are accumulated at an interface between the $In_zGa_{1-z}N$ ($0<z<1$) layer and the electron injection adjusting layer, and negative potential is biased at the interface. As a result, the barrier of the electron injection adjusting layer is higher by the increase in the electron level due to large piezoelectric polarization induced by the $In_zGa_{1-z}N$ ($0<z<1$) layer. Thereby, the electron injection adjusting layer acts to further suppress the injection of electrons into the light-emitting layer.

Of the base layer, a region in which the electron injection adjusting layer is formed, is preferably made of GaN. GaN is preferably formed at a temperature of not more than 950° C. and not less than 800° C.

Of the region of the base layer in which the electron injection adjusting layer is formed, a lower region in contact with the electron injection adjusting layer and disposed at the substrate side preferably has a V pit originated from threading dislocation. The diameter of the V pit is preferably 20 nm to 300 nm on the surface in contact with the electron injection adjusting layer of the lower region.

The electron level of the bottom of conduction band of the electron injection adjusting layer is preferably higher in operation state than the highest electron level of the bottom of conduction band of the p-type layer side cladding layer. The Al composition ratio x and thickness of the electron injection adjusting layer are preferably adjusted so as to achieve a maximum light output.

The semiconductor light-emitting device of the present invention may have a layer other than the above. The light-emitting layer has a multi-quantum structure, and may have any number of layers. One layer unit of the repeating structure may have at least a well layer and a barrier layer, and may have other layer. The number of repetitions of one layer unit is an integer equal to or greater than three.

The p-type layer side cladding layer preferably comprises a superlattice layer including an $Al_{w1}Ga_{1-w1}N$ ($0<w1<1$) layer. The p-type layer side cladding layer may be a superlattice layer comprising a periodic structure of an $In_{w2}Ga_{1-w2}N$ layer and an $Al_{w1}Ga_{1-w1}N$ ($0<w1<1$) layer. This structure allows to effectively confine the electrons in the light-emitting layer, and to effectively inject holes into the light-emitting layer. As a result, the emission efficiency is improved. In the above invention, "Group III nitride semiconductor" encompasses a compound semiconductor represented by the formula $Al_{x1}Ga_{y1}In_{z1}N$ ($x1+y1+z1=1$, $0 \leq x1$, $y1$, $z1 \leq 1$); such a compound semiconductor in which a portion of Al, Ga, or In is substituted by another Group 13 element (i.e., B or Tl), or a portion of N is substituted by another Group 15 element (i.e., P, As, Sb, or Bi). Usually, Group III nitride semiconductor refers to GaN, AlGaN, InGaN, and AlGaInN essentially containing Ga.

The light-emitting layer may have a multi-quantum structure. Examples of the multiple quantum structure include a multiple quantum structure of AlGaN/GaN having any composition ratio, a multiple quantum structure of AlGaN/InGaN having any composition ratio, and a multiple quantum structure of AlGaN/GaN/InGaN having any composition ratio. The semiconductor light-emitting device may have a layer for improving electrostatic breakdown voltage (hereinafter, referred to as an "ESD layer") as a base layer.

In the present invention, an electron injection adjusting layer comprising a single layer made of $Al_xGa_yIn_{1-x-y}N$ ($0<x<1$, $0<y<1$, $0<x+y\leq1$) is formed in the base layer or as its top layer. The electron injection adjusting layer has the highest electron level of the bottom of conduction band in the base layer and the n-type superlattice layer, that is, in the n-type layers up to the light-emitting layer. Therefore, the electron injection adjusting layer provides a potential barrier against electrons to be injected into the active layer. As a result, the energy level of the electrons injected into the active layer is high, and the diffusion length of the electrons tunneled through the electron injection layer is short. This achieves a uniform electron density in a thickness direction of the light-emitting layer. Thus, the density of electron-hole pairs is made uniform in a thickness direction of the light-emitting layer, and the number of electrons contributing to light emission is increased, thereby improving the emission efficiency. In the n-type layers up to the light-emitting layer, only the electron injection adjusting layer provides a potential barrier against the electrons. Therefore, the emission efficiency can be easily maximized only by adjusting the Al composition ratio of the electron injection adjusting layer.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

Embodiment 1

Figure 1:
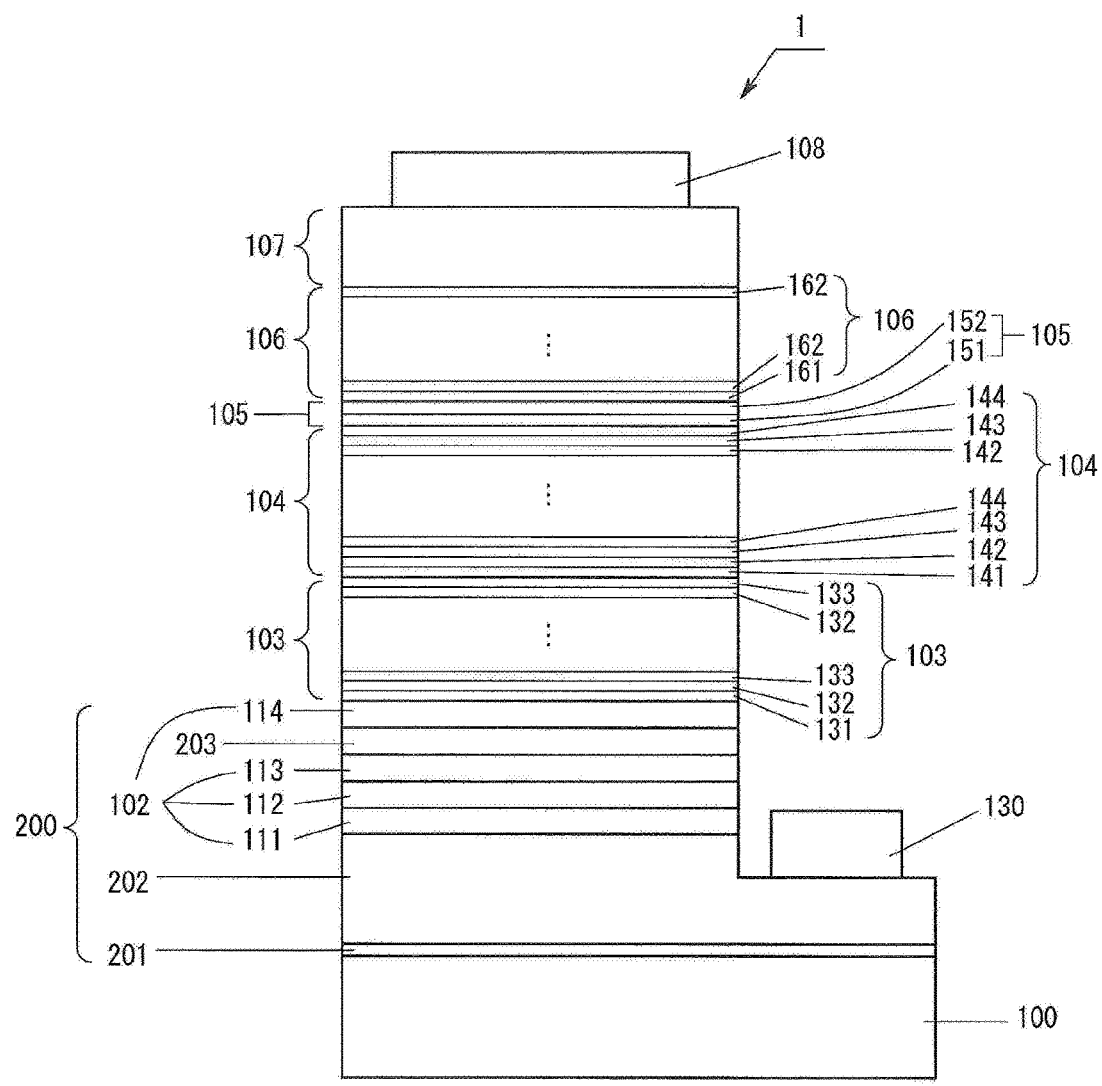
FIG. 1 shows the structure of a light-emitting device 1 according to Embodiment 1.

FIG. 1 shows the structure of a light-emitting device 1 according to Embodiment 1. The light-emitting device 1 has a structure a sapphire substrate 100; an n-type contact layer 202, an ESD layer (a layer for improving electrostatic breakdown voltage) 102, an n-type layer side superlattice layer (hereinafter, referred to as "n-type superlattice layer") 103, a light-emitting layer 104, an undoped cladding layer 105, a p-type layer side cladding layer (hereinafter, referred to as "p-type cladding layer") 106, and a p-type contact layer 107, the layers 202 to 107 being formed of a Group III nitride semiconductor and deposited on the substrate 100 via an AlN buffer layer 201; a p-electrode 108 formed on the p-type contact layer 107; and an n-electrode 130 formed on a portion of the n-type contact layer 202 exposed through removal of the corresponding portions of the layers 102 to 107 by etching from the p-type contact layer 107. A base layer 200 is a stack of all the single crystal layers except for the buffer layer 201 disposed between the sapphire substrate 100 and the n-type superlattice layer 103. That is, the base layer 200 comprises the n-type contact layer 202 and the ESD layer (a layer for improving electrostatic breakdown voltage) 102. An electron injection adjusting layer 203 comprising a single $Al_{0.35}Ga_{0.65}N$ layer with a thickness of 15 Å is provided in the base layer 200.

The sapphire substrate 100 has irregularities thereon to improve the light extraction efficiency. The sapphire substrate may be replaced with another growth substrate made of, for example, SiC, ZnO, Si, or GaN.

The n-type contact layer 202 is made of n-GaN having a Si concentration of $5\times10^{18}/cm^3$ or more. The n-type contact layer 202 may comprise a plurality of layers having different carrier concentrations for attaining good contact with the n-electrode 130.

The ESD layer 102 comprises a first ESD layer 111, a second ESD layer 112, a third ESD layer 113, and a fourth ESD layer 114 on the n-type contact layer 202. The first ESD layer 111 is made of n-GaN with a thickness of 500 nm and doped with Si at a concentration of $5\times10^{17}/cm^3$. The second ESD layer 112 is made of n-GaN with a thickness of 30 nm and doped with Si at a concentration of $6\times10^{18}/cm^3$. The third ESD layer 113 is made of undoped i-GaN with a thickness of 300 nm and having a residual electron concentration of $1\times10^{17}/cm^3$. The fourth ESD layer 114 is made of n-GaN with a thickness of 30 nm and doped with Si at a concentration of $6\times10^{18}/cm^3$. The first ESD layer 111 was grown at a high temperature of 1100° C., the second ESD layer 112, the third ESD layer 113, and the fourth ESD layer 114 were all grown at a low temperature of 850° C.

The first ESD layer 111 may have a thickness of 50 nm to 1000 nm, and a Si concentration of $1\times10^{16}$ to $10\times10^{17}/cm^3$. The surface of the first ESD layer 111 has pits with a density of $1\times10^8/cm^2$ or less. The second ESD layer 112 may have a thickness of 25 nm to 50 nm, and a Si concentration of $1\times10^{18}/cm^3$ to $10\times10^{18}/cm^3$. The surface of the third ESD layer 113 has also pits with a density of $1\times10^8/m^2$ or more.

The third ESD layer 113 may have a thickness of 50 nm to 500 nm, and preferably has an electron concentration as low as possible of $1\times10^{16}$ to $1\times10^{17}/cm^3$. The fourth ESD layer 114 may have a thickness of 25 nm to 50 nm, and a Si concentration of $1\times10^{18}/cm^3$ to $10\times10^{18}/cm^3$.

The electron injection adjusting layer 203 comprising a single undoped $Al_{0.35}Ga_{0.65}N$ layer with a thickness of 15 Å is formed between the third undoped ESD layer 113 and the fourth Si-doped ESD layer 114. The growth temperature was 850° C. same as in the third ESD layer 113 and the fourth ESD layer 114. The electron injection adjusting layer 203 may have a thickness of 5 Å to 30 Å. The electron injection adjusting layer 203 may be formed of AlGaN having an Al composition ratio of 0.15 to 0.5. Therefore, the Ga composition ratio is 0.5 to 0.85, and, preferably, 0.2 to 0.4. The electron injection adjusting layer 203 may be doped with Si, and show n-type conduction.

The n-type superlattice layer 103 has a superlattice structure including fifteen layer units, each layer unit comprising three layers sequentially deposited: an undoped $In_{0.08}Ga_{0.92}N$ layer 131 (thickness: 2.5 nm), an undoped GaN layer 132 (thickness: 0.7 nm), and a Si-doped n-GaN layer 133 (thickness: 1.4 nm). The initial layer of the n-type superlattice layer 103, which is in contact with the fourth ESD layer 114, is the $In_{0.08}Ga_{0.92}N$ layer 131, and the final layer of the n-type superlattice layer 103, which is in contact with the light-emitting layer 104, is the n-GaN layer 133. The overall thickness of the n-type superlattice layer 103 is 69 nm. The $In_{0.08}Ga_{0.92}N$ layer 131 may have a thickness of 1.5 nm to 5.0 nm. The undoped GaN layer 132 may have a thickness of 0.3 nm to 2.5 nm. The Si-doped n-GaN layer 133 may have a thickness of 0.3 nm to 2.5 nm.

The light-emitting layer 104 (may also be referred to as "active layer") has a MQW structure including three to ten layer units, each layer unit comprising four layers sequentially deposited: an $Al_{0.05}Ga_{0.95}N$ layer 141 (thickness: 2.4 nm), an $In_{0.2}Ga_{0.8}N$ layer 142 (thickness: 3.2 nm), a GaN layer 143 (thickness: 0.6 nm), and an $Al_{0.2}Ga_{0.8}N$ layer 144 (thickness: 0.6 nm). The initial layer of the light-emitting layer 104, which is in contact with the n-type superlattice layer 103, is the $In_{0.2}Ga_{0.8}N$ layer 142, and the final layer of the light-emitting layer 104, which is in contact with the undoped cladding layer 105, is the $Al_{0.2}Ga_{0.8}N$ layer 144. The overall thickness of the light-emitting layer 104 is 58.8 nm. All the layers of the light-emitting layer 104 are undoped. An undoped cladding layer 105 comprising an undoped GaN layer 151 (thickness: 2.5 nm) and an undoped $Al_{0.15}Ga_{0.85}N$ layer 152 (thickness: 3 nm) is interposed between the light-emitting layer 104 and the p-type cladding layer 106. The undoped cladding layer 105 is provided for the purpose of preventing diffusion of Mg contained in the layers formed above the undoped cladding layer 105 to the light-emitting layer 104.

The p-type cladding layer 106 has a layer unit including 12.5 layer units, each layer unit comprising two layers sequentially deposited: a p-$In_{0.05}Ga_{0.95}N$ layer 161 (thickness: 0.7 nm) and a p-$Al_{0.3}Ga_{0.7}N$ layer 162 (thickness: 1.4 nm). The initial layer of the p-type cladding layer 106, which is in contact with the undoped cladding layer 105, is the p-$Al_{0.3}Ga_{0.7}N$ layer 162, and the final layer of the p-type cladding layer 106, which is in contact with the p-type contact layer 107, is the p-$Al_{0.3}Ga_{0.7}N$ layer 162. The overall thickness of the p-type cladding layer 106 is 25.2 nm. Mg is used as a p-type impurity.

The p-type contact layer 107 is made of Mg-doped p-GaN. The p-type contact layer 107 may comprise a plurality of layers having different carrier concentrations for attaining good contact with the p-electrode 108. The above structure of the ESD layer 102 allows the light-emitting device 1 to have excellent electrostatic breakdown voltage, improved emission performance and reliability, and reduced current leakage.

Figure 2A:
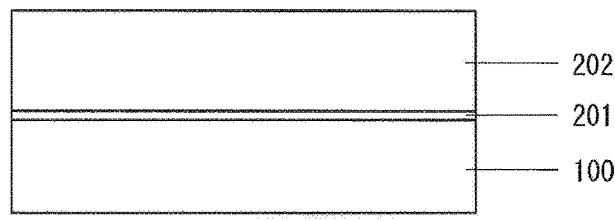
FIGS. 2A to 2C are sketches showing processes for producing the light-emitting device 1.
Figure 2B:
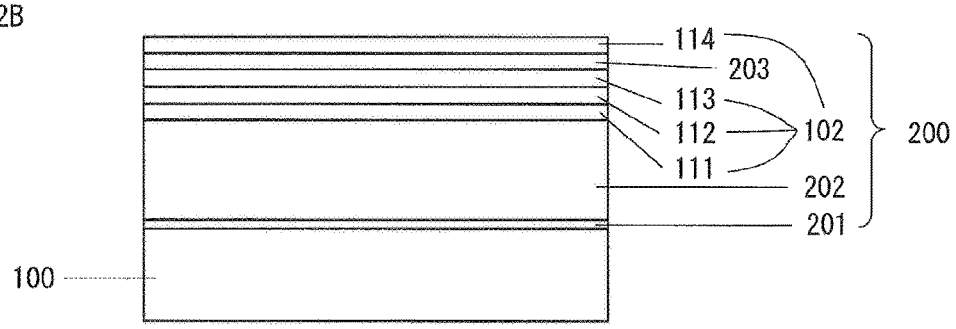
Figure 2C:
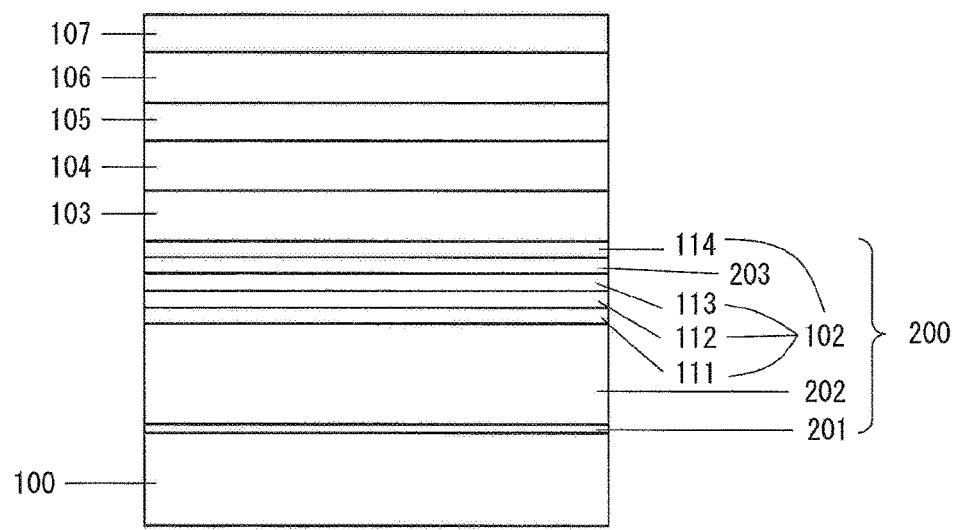

Next will be described a method for producing the light-emitting device 1 with reference to FIGS. 2A to 2C. In FIGS. 2A to 2C, a description of the periodic structures of the superlattice layers shown in FIG. 1 is omitted.

Crystal growth is carried out through metal-organic chemical vapor deposition (MOCVD). The gases employed are as follows: hydrogen or nitrogen ($H_2$ or $N_2$) as a carrier gas; ammonia gas ($NH_3$) as a nitrogen source; trimethylgallium ($Ga(CH_3)_3$, hereinafter referred to as "TMG") as a Ga source; trimethylindium ($In(CH_3)_3$, hereinafter referred to as "TMI") as an In source; trimethylaluminum ($Al(CH_3)_3$, hereinafter referred to as "TMA") as an Al source; silane ($SiH_4$) as an n-type dopant gas; and bis(cyclopentadienyl) magnesium ($Mg(C_5H_5)_2$, hereinafter referred to as "$Cp_2Mg$") as a p-type dopant gas.

Firstly, the sapphire substrate 100 was heated in a hydrogen atmosphere for cleaning, to thereby remove deposits from the surface of the sapphire substrate 100. Thereafter, the substrate temperature was maintained at 400° C., and the AlN buffer layer 201 was formed on the sapphire substrate 100 through MOCVD. Then, the substrate temperature was elevated to 1,100° C. under a stream of hydrogen gas (carrier gas) and ammonia gas. Immediately after the substrate temperature had reached 1,100° C., the n-type contact layer 202 formed of GaN having an Si concentration of $5×10^{18}/cm^3$ was deposited on the buffer layer 201 using TMG and ammonia gas as raw material gases, and silane gas as an impurity gas (FIG. 2A).

Subsequently, the ESD layer 102 was formed through the following processes. Firstly, on the n-type contact layer 202 was deposited, through MOCVD, the first ESD layer 111 made of n-GaN with a thickness of 500 nm and a Si concentration of $5×10^{17}/cm^3$. The growth temperature was adjusted to 1100° C. so as to grow a high-quality crystal having a pit density of $1×10^8/cm^2$ or less. When the growth temperature is adjusted to 1000° C. or more, a high-quality crystal is obtained.

Next, on the first ESD layer 111 was deposited, through MOCVD, the second ESD layer 112 made of n-GaN with a thickness of 30 nm and doped with Si at a concentration of $6×10^{18}/cm^3$. The growth temperature was adjusted to 850° C. The growth temperature may be adjusted to 850° C. to 950° C. Subsequently, on the second ESD layer 112 was deposited, through MOCVD, the third ESD layer 113 made of undoped i-GaN with a thickness of 300 nm and having a residual electron concentration of $1×10^{17}/cm^3$. The growth temperature was adjusted to 850° C. The growth temperature may be adjusted to 800° C. to 950° C. When the carrier concentration is $5×10^{17}/cm^3$ or less, a crystal having a pit density of $1×10^8/cm^2$ or more is obtained. When the growth temperature is adjusted to 800° C. to 900° C., a pit density is increased, which is preferred.

Then, on the third ESD layer 113 was deposited, through MOCVD, the electron injection adjusting layer 203 comprising a single layer made of undoped $Al_{0.35}Ga_{0.65}N$ with a thickness of 15 Å. The growth temperature was adjusted to 850° C. The growth temperature may be adjusted to 800° C. to 950° C., same as in the second ESD layer 112 and the third ESD layer 113.

Subsequently, on the electron injection adjusting layer 203 was deposited, through MOCVD, the fourth ESD layer 114 made of n-GaN with a thickness of 30 nm and doped with Si at a concentration of $6×10^{18}/cm^3$. The growth temperature was adjusted to 850° C. The growth temperature may be adjusted to 800° C. to 950° C. Through the above processes, the base layer 200 from the AlN buffer layer 201 to the fourth ESD layer 114 was formed (FIG. 2B).

Next, on the fourth ESD layer 114, through MOCVD, the n-type superlattice layer 103 was deposited. The n-type superlattice layer 103 was formed by repeating a layer unit fifteen times, each layer unit comprising the undoped $In_{0.08}Ga_{0.92}N$ layer 131 (thickness: 2.5 nm), the undoped i-GaN layer 132 (thickness: 0.7 nm), and the Si-doped n-GaN layer 133 (thickness: 1.4 nm). The $In_{0.08}Ga_{0.92}N$ layer 131 was formed under supply of silane gas, TMG, TMI, and ammonia while the substrate temperature was maintained at 830° C. The n-GaN layer 133 was formed under supply of TMG and ammonia while the substrate temperature was maintained at 830° C.

Then, the light-emitting layer 104 was formed on the n-type superlattice layer 103. The light-emitting layer 104 was formed by repeating a layer unit nine times, each layer unit comprising four layers of the $Al_{0.05}Ga_{0.95}N$ layer 141, the $In_{0.2}Ga_{0.8}N$ layer 142, the GaN layer 143, and the $Al_{0.2}Ga_{0.8}N$ layer 144. The growth temperature of the $Al_{0.2}Ga_{0.8}N$ layer 144 was adjusted to any temperature of 800° C. to 950° C. The growth temperature of the $In_{0.2}Ga_{0.8}N$ layer 142 serving as a well layer, the GaN layer 143, and the $Al_{0.05}Ga_{0.95}N$ layer 141 serving as a barrier layer was adjusted to 750° C. to 850° C. Needless to say, in the growth of the four layers 141, 142, 143, and 144, the temperature of the substrate on which the layers are formed may be commonly maintained constant. The light-emitting layer 104 was formed under supply of the corresponding raw material gases to grow each of the layers 141 to 144.

Subsequently, on the light-emitting layer 104, the undoped GaN layer 151 was grown so as to have a thickness of 2.5 nm at a substrate temperature of 855° C. under supply of TMG and ammonia. Then, the undoped $Al_{0.15}Ga_{0.85}N$ layer 152 was grown so as to have a thickness of 3 nm under supply of TMA, TMG, and ammonia while the substrate temperature was maintained at 855° C. Thus, the undoped cladding layer 105 was formed.

Next, the p-type cladding layer 106 was formed on the undoped cladding layer 105. The p-$In_{0.05}Ga_{0.95}N$ layer 161 was formed so as to have a thickness of 0.7 nm at a substrate temperature of 855° C. under supply of $CP_2Mg$, TMI, TMG, and ammonia. The p-$Al_{0.3}Ga_{0.7}N$ layer 162 was formed so as to have a thickness of 1.4 nm at a substrate temperature of 855° C. under supply of $CP_2Mg$, TMA, TMG, ammonia. This layer formation process was repeated 12.5 times.

Then, the substrate temperature was adjusted to 1000° C., and the p-type contact layer 107 (thickness: 50 nm) was formed of p-type GaN doped with Mg at a concentration of $1×10^{20}/cm^3$ by use of TMG, ammonia, and $CP_2Mg$. Thus, the device structure shown in FIG. 2C was formed. The p-type contact layer 107 may have an Mg concentration of $1×10^{19}/cm^3$ to $1×10^{21}/cm^3$. The p-type contact layer 107 may have a thickness of 10 nm to 100 nm.

Subsequently, Mg was activated through thermal treatment, and then dry etching was performed from the top surface of the p-type contact layer 107, to thereby form a trench reaching the n-type contact layer 202. The p-electrode 108 was formed of Ni/Au/Al (which were deposited in this order on the p-type contact layer 107) on the top surface of the p-type contact layer 107. The n-electrode 130 was formed of Ni/Au (which were deposited in this order on the n-type contact layer 202) on the surface of the n-type contact layer 202 exposed at the bottom of the trench through dry etching. From the above, the light-emitting device 1 shown in FIG. 1 was produced.

Figure 3:
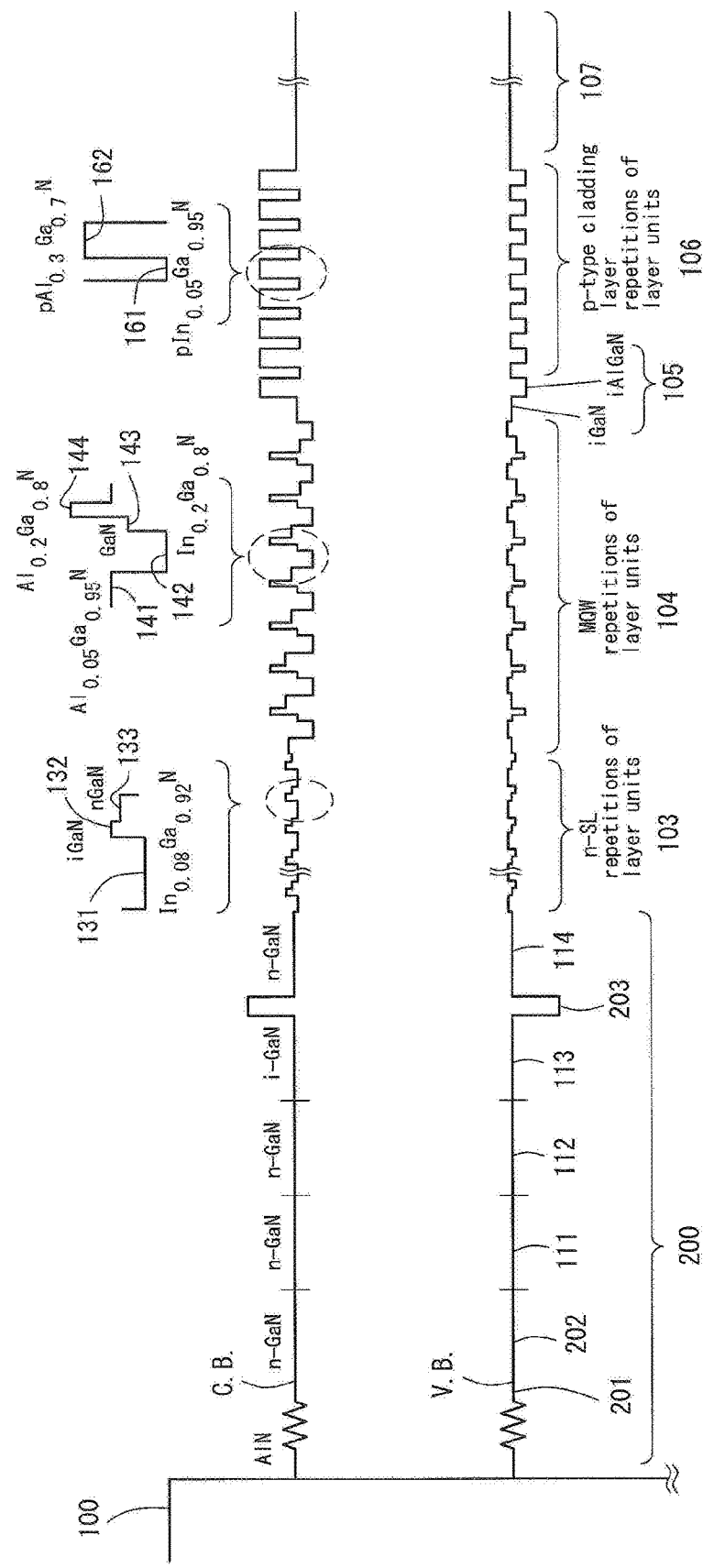
FIG. 3 shows the band structure of the light-emitting device according to Embodiment 1.

FIG. 3 shows the band structure of the light-emitting device 1. In the conduction band, the electron injection adjusting layer 203 comprising a single $Al_{0.35}Ga_{0.65}N$ layer provides the highest potential barrier against the electrons to be injected from the n-type contact layer 202 into the light-emitting layer 104. Therefore, the energy of the injected electrons is high, and the diffusion length is short. The diffusion length of the electrons is controlled by the barrier height of the electron injection adjusting layer 203. This achieves a uniform electron density in a thickness direction of the light-emitting layer 103, and the electrons are effectively combined with the holes injected into the light-emitting layer 103, thereby improving the emission efficiency.

As a comparative example, a light-emitting device having the same structure as the light-emitting device of FIG. 1 was produced, except for that the electron injection adjusting layer 203 comprising a single $Al_{0.35}Ga_{0.65}N$ layer is not provided. The emission output of the light-emitting device according to Embodiment 1 was improved 1.009 times the output of the light-emitting device of comparative example. The reverse leakage current was 0.079 μmA in the comparative example, but the reverse leakage current was 0.052 μA in Embodiment 1, resulting in ⅔ the reverse leakage current of the comparative example.

The thickness and the composition ratio of the electron injection adjusting layer 203 are adjusted so that the emission output is maximum. The optimum thickness range is 5 Å to 30 Å. When the thickness is thinner than 5 Å, the function of adjusting the electron injection is not fulfilled. When the thickness is thicker than 30 Å, the resistance increases and the drive voltage remarkably increases, which is not preferable. When the thickness falls within this range, the increase of the drive voltage can be minimized in the electron injection adjusting layer 203. The diffusion length of the electrons to be injected into the light-emitting layer 103 becomes shorter, and the electron density in a thickness direction of the light-emitting layer 103 is further made uniform, thereby improving the emission output.

In the above embodiment, the electron injection adjusting layer 203 was formed between the third ESD layer 113 and the fourth ESD layer 114. The position of the electron injection adjusting layer 203 is not limited to this. The electron injection adjusting layer 203 may be formed between the second ESD layer 112 and the third ESD layer 113, between the first ESD layer 111 and the second ESD layer 112, and between the n-type contact layer 202 and the first ESD layer 111. That is, the electron injection adjusting layer 203 may be formed in the base layer 200. The electron injection adjusting layer 203 may be formed between the fourth ESD layer 114 and the n-type superlattice layer 103. That is, the electron injection adjusting layer 203 may be formed as the top layer of the base layer 200. Forming the electron injection adjusting layer 203 in the n-type superlattice layer 103 inhibits the effect of relaxing the strain due to the n-type superlattice layer 103, which is not preferable. The electron injection adjusting layer 203 was undoped. However, the electron injection adjusting layer may be doped with Si. Indium may be added to AlGaN of the electron injection adjusting layer 203 to improve the crystallinity. The electron injection adjusting layer 203 may be formed of AlGaInN essentially containing Al.

In the above embodiment, the n-type superlattice layer 103 has a periodic structure of the undoped $In_{0.08}Ga_{0.92}N$ layer 131, the undoped GaN layer 132, and the Si-doped n-GaN layer 133, the layers being deposited in this order on the n-type contact layer 202. However, the n-type superlattice layer 103 may have a periodic structure of the $In_{0.08}Ga_{0.92}N$ layer, the Si-doped n-GaN layer, and the undoped GaN layer deposited in this order; the Si-doped n-GaN layer, the undoped GaN layer, and the $In_{0.08}Ga_{0.92}N$ layer deposited in this order; and the Si-doped n-GaN layer, the $In_{0.88}Ga_{0.92}N$ layer, and the undoped GaN layer deposited in this order. The $In_{0.08}Ga_{0.92}N$ layer 131 may be doped with Si, so as to serve as an n-type layer. The GaN layer 133 may be undoped. The Si-doped $Al_{0.2}Ga_{0.8}N$ layer 133 may be used instead of the Si-doped n-GaN layer 133. The $Al_{0.2}Ga_{0.8}N$ layer 133 may be undoped.

The n-type superlattice layer 103 comprises fifteen layer units, but the number of layer units is not limited thereto. For example, the number of layer units may be three to thirty. The undoped GaN layer 132 may have a thickness of 0.3 nm to 2.5 nm. The Si-doped GaN layer 133 may have a thickness of 0.3 nm to 2.5 nm. The $In_{0.88}Ga_{0.92}N$ layer 131 may have a thickness of 1.5 nm to 5.0 nm.

In the above embodiment, the p-type cladding layer 106 may have a periodic structure of AlGaN/GaN or a periodic structure of AlGaN/AlGaN having different composition ratios in addition to a periodic structure of InGaN/AlGaN.

The Group III nitride semiconductor light-emitting device of the present invention exhibits improved emission performance without increasing the drive voltage.

What is claimed is:

1. A Group III nitride semiconductor light-emitting device comprising:
   a substrate;
   a base layer comprising an n-type layer side contact layer consisting of GaN doped with Si and an ESD layer consisting of GaN for improving electrostatic breakdown voltage formed on the n-type layer side contact layer;
   an n-type layer side superlattice layer formed on and in contact with the base layer;
   a light-emitting layer formed on and in contact with the n-type layer side superlattice layer;
   a p-type layer side cladding layer formed on and in contact with the light-emitting layer;
   a p-type layer side contact layer formed on and in contact with the p-type layer side cladding layer, each of the layers being formed of a Group III nitride semiconductor;
   an n-electrode formed on an exposed area of the n-type layer side contact layer; and
   a p-electrode formed on the p-type layer side contact layer;
   wherein the n-type layer side superlattice layer has a layered structure of an $In_zGa_{1-z}N$ (0<z<1) layer having a constant composition ratio over the entire cycles and a GaN layer repeatedly deposited; and
   wherein the base layer includes an electron injection adjusting layer which is formed in a path in which the electrons injected from the n-electrode flow to the p-electrode, as a layer disposed in the base layer or a layer in contact with the n-type superlattice layer, and which comprises a single layer consisting of an undoped $Al_xGa_yN$ (0<x<1, 0<y<1) layer having an electron level of the bottom of conduction band higher than that of any other layers constituting the base layer and having a thickness of 5 Å to 30 Å at which electrons injected from the n-electrode are able to tunnel, and an Al composition ratio x of 0.15 to 0.5.

2. The Group III nitride semiconductor light-emitting device according to claim 1, wherein an $In_zGa_{1-z}N$ ($0<z<1$) layer is in contact with the surface at the light-emitting layer side of the electron injection adjusting layer.

3. The Group III nitride semiconductor light-emitting device according to claim 1, wherein of the region of the base layer in which the electron injection adjusting layer is formed, a lower region in contact with the electron injection adjusting layer and disposed at the substrate side has a V pit originated from threading dislocation, and
wherein the diameter of the V pit is 20 nm to 300 nm on the surface in contact with the electron injection adjusting layer of the lower region.

4. The Group III nitride semiconductor light-emitting device according to claim 1, wherein the electron level of the bottom of conduction band of the electron injection adjusting layer is higher in operation state than the highest electron level of the bottom of conduction band of the p-type layer side cladding layer.

5. The Group III nitride semiconductor light-emitting device according to claim 1, wherein the Al composition ratio x and thickness of the electron injection adjusting layer are adjusted so as to achieve a maximum light output.

6. A Group III nitride semiconductor light-emitting device comprising:
a substrate;
an n-type layer side contact layer consisting of GaN doped with Si in a concentration of $5\times10^{18}/cm^3$ or more;
an ESD layer for improving electrostatic breakdown voltage formed on and in contact with the n-type layer side contact layer;
an n-type layer side superlattice layer formed on and in contact with the ESD layer;
a light-emitting layer formed on and in contact with the n-type layer side superlattice layer;
a p-type layer side cladding layer formed on and in contact with the light-emitting layer;
a p-type layer side contact layer formed on and in contact with the p-type layer side cladding layer, each of the layers being formed of a Group III nitride semiconductor;
an n-electrode formed on an exposed area of the n-type layer side contact layer; and
a p-electrode formed on the p-type layer side contact layer;
wherein the n-type layer side superlattice layer has a layered structure of an $In_zGa_{1-z}N$ ($0<z<1$) layer having a constant composition ratio over the entire cycles and a GaN layer repeatedly deposited; and
wherein the ESD layer comprises at least four layers of a first n-GaN layer doped with Si and directly contacted with the n-type layer side superlattice layer, an electron injection adjusting layer as a single layer consisting of an undoped $Al_xGa_yN$ ($0<x<1$, $0<y<1$) layer and directly contacted with the first n-GaN layer, an undoped GaN layer directly contacted with the electron injection adjusting layer, and a second n-GaN layer doped with Si and directly contacted with the undoped GaN layer, the electron injection adjusting layer having an electron level of the bottom of conduction band higher than that of any other layers constituting the ESD layer and the n-type layer side contact layer, and having a thickness of 5 Å to 30 Å and an Al composition ratio x of 0.15 to 0.5, and
wherein the first n-GaN layer has a thickness of 25 nm to 50 nm and a Si concentration of $1\times10^{18}/cm^3$ to $10\times10^{18}/cm^3$, the undoped GaN layer has a thickness of 50 nm to 500 nm, the second n-GaN layer has a thickness of 25 nm to 50 nm and a Si concentration of $1\times10^{18}/cm^3$ to $10\times10^{18}/cm^3$, and the second n-GaN layer has a thickness of 25 nm to 50 nm and a Si concentration of $1\times10^{18}/cm^3$ to $10\times10^{18}/cm^3$, and
wherein an interface between the undoped GaN layer and the electron injection adjusting layer has a V pit with a diameter of 20 nm to 300 nm and a density of $1\times10^8/cm^2$ or more originated from threading dislocation, and
wherein the electron level of the bottom of conduction band of the electron injection adjusting layer is higher in operation state than the highest electron level of the bottom of conduction band of the p-type layer side cladding layer, and
wherein the Al composition ratio x and thickness of the electron injection adjusting layer are adjusted so as to achieve a maximum light output.

7. The Group III nitride semiconductor light-emitting device according to claim 6, wherein the ESD layer further comprises a third n-GaN layer with a thickness of 50 nm to 1000 nm and a Si concentration of $1\times10^{16}/cm^3$ to $10\times10^{17}/cm^3$ contacted with the second n-GaN layer and n-type layer side contact layer.

* * * * *